United States Patent
Chang et al.

(10) Patent No.: US 8,101,287 B1
(45) Date of Patent: Jan. 24, 2012

(54) HOUSING

(75) Inventors: Hsin-Pei Chang, Tu-Cheng (TW);
Wen-Rong Chen, Tu-Cheng (TW);
Huan-Wu Chiang, Tu-Cheng (TW);
Cheng-Shi Chen, Tu-Cheng (TW);
Man-Xi Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/968,412

(22) Filed: Dec. 15, 2010

(30) Foreign Application Priority Data

Sep. 15, 2010 (CN) .......................... 2010 1 0282318

(51) Int. Cl.
*B32B 15/00* (2006.01)
*B32B 15/04* (2006.01)
*H02B 1/00* (2006.01)
*H02B 1/26* (2006.01)
*H05K 5/00* (2006.01)
*H05K 5/04* (2006.01)

(52) U.S. Cl. ........ 428/649; 428/632; 428/627; 428/646; 428/666; 361/600; 361/679.01; 361/679.56

(58) Field of Classification Search .................. 428/632, 428/627, 649, 646, 666, 336, 938
See application file for complete search history.

(56) References Cited

U.S. PATENT DOCUMENTS 6,669,997 B2 * 12/2003 Luan et al. .................... 427/601
* cited by examiner

*Primary Examiner* — Michael Lavilla
(74) *Attorney, Agent, or Firm* — Altis Law Group, Inc.

(57) ABSTRACT

A housing includes a substrate; a tin layer deposited on the substrate; a magnesium-tin layer formed between the substrate and the tin layer; a chromium layer deposited on the tin layer; a chromium-tin layer formed between tin layer on the chromium layer; and a chromium oxide or nitrogen layer deposited on the chromium layer. The substrate is made of magnesium or magnesium alloy; the tin layer is comprised of tin; the magnesium-tin layer is a magnesium-tin layer; the chromium layer is comprised of chromium; the chromium-tin layer is a chromium-tin layer; the chromium oxide or nitrogen layer is a chromium oxide nitrogen layer.

8 Claims, 1 Drawing Sheet

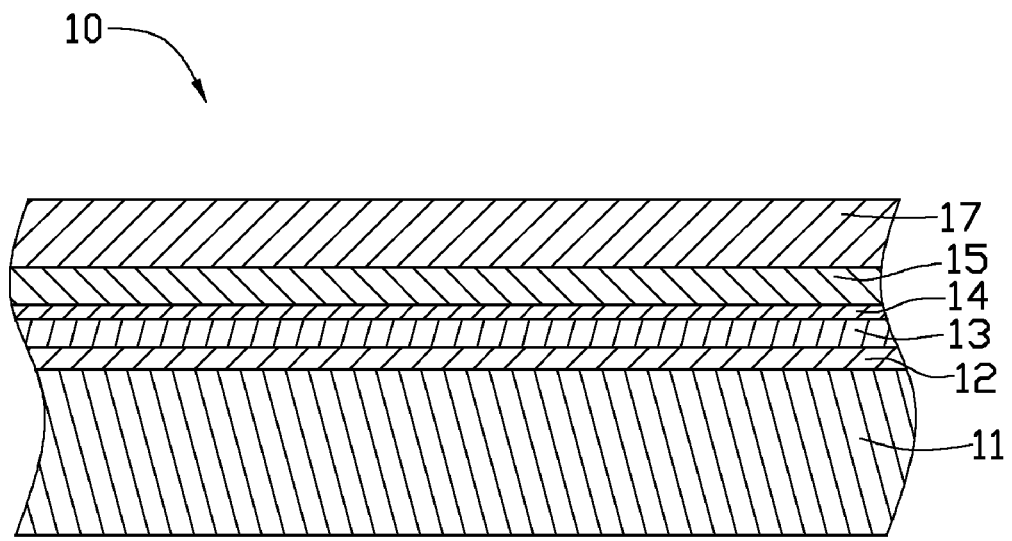

HOUSING

CROSS-REFERENCE TO RELATED APPLICATIONS

The present application is related to co-pending U.S. patent application Ser. Nos. 12/968,403, 12/968,406), entitled "HOUSING AND METHOD FOR MANUFACTURING HOUSING", by Zhang et al., and the current status of these application are both not examined. These applications have the same assignee as the present application and have been concurrently filed herewith. The above-identified applications are incorporated herein by reference.

BACKGROUND

1. Technical Field

The exemplary disclosure generally relates to housings and a method for manufacturing the housings.

2. Description of Related Art

With the development of wireless communication and information processing technology, portable electronic devices, such as mobile telephones and electronic notebooks are now widely used. Magnesium and magnesium alloys have good heat dissipation and can effectively shield electromagnetic interference. Therefore, the magnesium and magnesium alloy are widely used to manufacture the housings of the portable electronic device. However, magnesium and magnesium alloy have a lower erosion resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary housing and method for manufacturing the housing. Moreover, in the drawings like reference numerals designate corresponding parts throughout the several views. Wherever possible, the same reference numbers are used throughout the drawings to refer to the same or like elements of an embodiment.

FIG. 1 is a cross-sectional view of an exemplary embodiment of a housing.

DETAILED DESCRIPTION

Referring to FIG. 1, an exemplary housing 10 includes a substrate 11 made of magnesium or a magnesium alloy. A first layer 13 is deposited on the substrate 11, a second layer 12 is formed between the substrate 11 and the first layer 13. A third layer 15 is deposited on the first layer 13, a fourth layer 14 is formed between first layer 13 on the third layer 15 and a fifth layer 17 is deposited on the third layer 15.

The first layer 13 is comprised of tin, and may be deposited on the substrate 11 with a tin target by magnetron sputtering process. The second layer 12 is a magnesium-tin alloy layer. The second layer 12 is formed between the first layer 13 and the substrate 11 in such a way that the tin in the first layer 13 diffuses toward the magnesium in the substrate 11 during deposition of the first layer 13 on the substrate 11.

The third layer 15 is comprised of chromium, and may be deposited on the first layer 13 with a chromium target by magnetron sputtering process. The fourth layer 14 is a chromium-tin alloy. The fourth layer 14 is formed between the first layer 13 and the third layer 15, in such a way that the chromium in the third layer 15 diffuses toward the tin in the first layer 13 during depositing the third layer 15 on the first layer 13.

The fifth layer 17 is chromium oxide nitrogen layer. The fifth layer 17 is a chromium oxide nitrogen layer. The fifth layer 17 may be deposited on the third layer 15 with a chromium target, nitrogen, and oxygen, by magnetron sputtering process. The third layer 15 has a thickness ranging from about 0.2 micrometer to about 0.5 micrometer. The fifth layer 17 has a thickness ranging from about 0.2 micrometer to about 2.0 micrometer.

A method for manufacturing the housing 10 includes the following steps.

A substrate 11 is provided. The substrate 11 may be made of magnesium or magnesium alloy and may be molded by a punching method.

The substrate 11 is pretreated. First, the substrate 11 is washed with a solution (e.g., alcohol or Acetone) in an ultrasonic cleaner, to remove, e.g., grease, dirt, and/or impurities. Second, the substrate 11 is dried. Third, the substrate 11 is cleaned by argon plasma cleaning. The substrate 11 is retained on a rotating bracket in a vacuum chamber of a magnetron sputtering coating machine. The vacuum level of the vacuum chamber is adjusted to $8.0 \times 10^{-3}$ Pa. Pure argon is floated into the vacuum chamber at a flux of about 300 Standard Cubic Centimeters per Minute (sccm) to about 600 sccm from a gas inlet, to act as a reaction gas. A bias voltage is applied to the substrate 11 in a range from about −300 to about −800 volts for a time of about 3 to about 10 min. So the substrate 11 is washed by argon plasma, to further remove the grease or dirt. Thus, the binding force between the substrate 11 and the first layer 13 is enhanced.

The first layer 13 is deposited on the substrate 11. The temperature in the vacuum chamber is adjusted to 50~150° C., i.e., the magnetron sputtering temperature of the first layer 13 is 50~150° C.; argon which is floated into the vacuum chamber at a flux from about 100 sccm to about 300 sccm; the speed of the rotating bracket is adjusted to about 0.5 to 3 revolution per minute (rpm); a tin target in the vacuum chamber is evaporated in a power from about 5 kw to about 10 kw; a bias voltage applied to the substrate 11 is in a range from −50 to −300 volts for a time of about 20 min to about 60 min, to deposit the first layer 13 on the substrate 11. During this step, the second layer 12 is formed between the first layer 13 and the substrate 11, in such a way that the tin in the first layer 13 diffuses toward the magnesium in the substrate 11. The second layer 12 can improve the electrochemically potential of the housing 10 to prevent the housing 10 from electrochemically eroding.

The third layer 15 is deposited on the first layer 13. The temperature of the vacuum chamber is kept from about 50 to about 150, i.e., the magnetron sputtering temperature of the third layer 15 is 50~150° C.; the vacuum level of the vacuum chamber is kept at $8.0 \times 10^{-3}$~$5.0 \times 10^{-2}$ Pa; pure argon is floated into the vacuum chamber at a flux from about 100 sccm to about 300 sccm from the gas inlet; the bias voltage applied to the substrate 11 is ranging from −50 to −300 volts; a chromium target in the vacuum chamber is evaporated for a time of about 20 min to about 60 min, to deposit the third layer 15 on the first layer 13. During this step, the fourth layer 14 is formed between the first layer 13 and the third layer 15, in such a way that the chromium in the third layer 15 diffuses toward the tin in the first layer 13. The fourth layer 14 can improve the electrochemically potential of the housing 10 to prevent the housing 10 from electrochemically eroding.

The fifth layer 17 is deposited on the third layer 15. The temperature of the vacuum chamber is kept from 50 to 150, i.e., the magnetron sputtering temperature of the fifth layer 17 is 50~150° C.; the vacuum level of the vacuum chamber is kept at 8.0×10-3~5.0×10-2 Pa; pure nitrogen is floated into the vacuum chamber at a flux of about 10 sccm to 120 sccm and oxygen is floated into the vacuum chamber at a flux of about 10 sccm to 60 sccm from the gas inlet; the bias voltage applied to the substrate 11 is ranging from −50 to −300 volts; the chromium target is evaporated for a time of about 30 min to about 90 min, to deposit the fifth layer 17 on the third layer 15. During this stage, the chromium, the nitrogen, and the oxygen react to chromium (nitrogen, oxygen) solid solution phase, chromium-nitrogen phase and $Cr_2O_3$ phase. The chromium (nitrogen, oxygen) solid solution phase, chromium-nitrogen phase, and $Cr_2O_3$ phase can prevent columnar crystal from forming in the fifth layer 17, to improve the compactness of the fifth layer 17. Thus, the erosion resistance of the housing 10 can be improved.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A housing, comprising:
    a magnesium or magnesium alloy substrate;
    a tin layer deposited on the substrate;
    a magnesium-tin layer formed in the substrate during deposition of the tin layer on the substrate;
    a chromium layer deposited on the tin layer;
    a chromium-tin layer formed in the tin layer during deposition of the chromium layer on the tin layer; and
    a chromium oxide nitrogen layer comprising chromium (nitrogen, oxygen) solid solution phase, chromium-nitrogen phase, and $Cr_2O_3$ phase, deposited on the chromium layer.

2. The housing as claimed in claim 1, wherein the tin layer is deposited on the substrate with a tin target by magnetron sputtering process.

3. The housing as claimed in claim 2, wherein the magnesium-tin layer is formed such that the tin in the tin layer diffuses toward the magnesium in the substrate when deposition of the tin layer on the substrate.

4. The housing as claimed in claim 1, wherein the chromium layer is deposited on the tin layer with a chromium target by magnetron sputtering process.

5. The housing as claimed in claim 4, wherein the chromium-tin layer is formed such that the chromium in the chromium layer diffuses toward the tin in the tin layer during deposition of the chromium layer on the tin layer.

6. The housing as claimed in claim 1, wherein the chromium oxide nitrogen layer is deposited on the chromium layer with a chromium target, nitrogen gas and oxygen gas, by magnetron sputtering process.

7. The housing as claimed in claim 1, wherein the chromium layer has a thickness ranging from about 0.2 micrometer to about 0.5 micrometer after formation of the chromium-tin layer.

8. The housing as claimed in claim 1, wherein the chromium oxide nitrogen layer has a thickness ranging from about 0.2 micrometer to about 2.0 micrometer.

* * * * *